United States Patent
Dougherty et al.

[11] Patent Number: 5,908,658
[45] Date of Patent: Jun. 1, 1999

[54] PROCESS FOR FORMING THIN FILM METAL OXIDE MATERIALS HAVING IMPROVED ELECTRICAL PROPERTIES

[75] Inventors: Thomas K. Dougherty, Playa Del Rey; O. Glenn Ramer, Los Angeles, both of Calif.

[73] Assignee: Raytheon Company, El Segundo, Calif.

[21] Appl. No.: 08/897,137

[22] Filed: Jul. 22, 1997

[51] Int. Cl.$^6$ .................................................. B05D 5/12
[52] U.S. Cl. ............................................. 427/79; 427/126.3
[58] Field of Search ............................... 427/226, 126.3, 427/79

[56] References Cited

U.S. PATENT DOCUMENTS

| | | | |
|---|---|---|---|
| 5,434,102 | 7/1995 | Watanabe et al. | 437/130 |
| 5,439,845 | 8/1995 | Watanabe et al. | 437/130 |
| 5,601,869 | 2/1997 | Scott et al. | 427/126.3 |
| 5,612,082 | 3/1997 | Azuma et al. | 427/96 |
| 5,721,009 | 2/1998 | Dougherty et al. | 427/126.6 |

OTHER PUBLICATIONS

C.A–Paz de Araujo et al, "Fatigue–free ferroelectric capacitors with platinum electrodes", *Nature*, vol. 374, pp. 627–629 (Apr. 1995).

*Primary Examiner*—Roy V. King
*Attorney, Agent, or Firm*—Colin M. Raufer; Leonard A. Alkov; Glenn H. Lenzen, Jr.

[57] ABSTRACT

A process is provided for preparing mixed metal oxide materials having improved leakage characteristics when formed into a capacitor. The process comprises: (a) preparing a solution of a liquid precursor of the mixed metal oxide materials having a given composition in a water-immiscible solvent; (b) adding a small amount of water to the solution to form a two-phase mixture; (c) refluxing the two-phase mixture for a period of time; and (d) removing the water. Optionally, an additional amount of the water-immiscible solvent may be added prior to removing the water. In this case, both the added amount of the water-immiscible solvent and the water are removed simultaneously. The treated metal organic acid salt solutions provide ceramic thin films having improved leakage characteristics as compared to the prior art thin films prepared from untreated prior art solutions.

8 Claims, 2 Drawing Sheets

PROCESS FOR FORMING THIN FILM METAL OXIDE MATERIALS HAVING IMPROVED ELECTRICAL PROPERTIES

This invention was made with United States Government support under Contract No. N00030-94-C-0001 awarded by the Department of the Navy. The U.S. Government has certain rights in this invention.

BACKGROUND OF THE INVENTION

1. Field of the Invention

The present invention relates to an improved process for fabricating metal oxide materials and devices made therefrom via the metallo-organic decomposition method.

2. Description of Related Art

A new class of layered ferroelectric materials having a layered perovskite structure have begun finding use as thin ferroelectric films in radiation-hard, non-volatile microelectronic memories, high dielectric constant capacitors, energy storage devices, and the like. These layered materials comprise complex oxides of metals such as strontium, calcium, barium, bismuth, cadmium, lead, titanium, tantalum, hafnium, tungsten, niobium, zirconium, scandium, yttrium, lanthanum, antimony, chromium, and thallium that spontaneously form layered crystalline lattices that include alternating layers of distinctly different sublattices, such as ferroelectric and non-ferroelectric sublattices. Generally, each layered material will include two or more of the above metals. For example, strontium, bismuth, and tantalum form the layered material strontium bismuth tantalate, $SrBi_2Ta_2O_9$ (SBTO).

A variety of techniques has been disclosed for fabricating such layered ferroelectric materials; see, e.g., U.S. Pat. Nos. 5,434,102 and 5,439,845, both issued to H. Watanabe et al, which are directed to metallo-organic decomposition (MOD) to form the layered ferroelectric materials. The coated wafer is baked to dry and decompose the precursor and annealed to form a layered material on the wafer. Each metal in the ferroelectric material is formed separately as a carboxylate and the carboxylates are combined prior to application to the wafer. The carboxylates may be formed (in the case of strontium) by reacting the metal with a carboxylic acid. For the case of the other metals, these may be formed by reaction of a carboxylic acid with a metal alkyl or aryl, or with a metal alkoxide, or more preferably, with the acid anhydride and metal alkoxide; see, application Ser. No. 08/669,122, filed Jun. 24, 1996, now U.S. Pat. No. 5,721,009

An important application of the layered ferroelectric materials includes ferroelectric capacitors (see, e.g., C. A. Paz de Arujo et al, "Fatigue-free ferroelectric capacitors with platinum electrodes", *Nature*, Vol. 374, pp. 627–629 [Apr. 13, 1995]). A problem associated with these capacitors, and with thin film metal oxide dielectrics in general, is an unacceptably high leakage current.

Previous work in the art of ferroelectric materials has concentrated on the bismuth layered structure $SrBi_2Ta_2 O_9$ (SBTO). It has been shown that this material can produce devices with much improved retention of polarization and fatigue (useful number of cycles of polarization) as compared to other ferroelectric metal oxides (for example, lead zirconium titanate [PZT]). Symetrix Corporation and its licensee, Ku-jundo Chemical of Japan, offer for sale a liquid source and process to construct SBTO material and devices. However, the inventors of the present invention have found that the supplied chemicals and process do not give devices with consistent electrical properties nor devices with sufficient properties at elevated temperatures.

In the patents and publications listed above, Symetrix Corporation describes liquid source materials and a process to produce bismuth-layered ceramic thin film ferroelectric devices. Both Symetrix, and their licensee (Kojundo Chemical) offer for sale the liquid source to the material, named "Y1", which is disclosed as the bismuth-layered structure $SrBi_2Ta_2O_9$. According to the Symetrix disclosures, a liquid source containing a metal salt—organic acid mixture having the stoichiometry of $Bi_{2.18}Sr_{0.99}$-$Ta_{2.00}$ gives on processing the desired Y1 material. However, in the experience of the present inventors, the liquid source of Y1 supplied by either Symetrix or Kojundo does not on processing always give Y1 ferroelectric films of consistent electrical quality. Also, the Y1 thus formed, even in its best examples, does not have sufficient high temperature performance to meet the critical needs of the military and space systems hardware electronics applications.

In light of the foregoing, the present inventors disclosed in application Ser. No. 08/635,313, filed Apr. 19, 1996, now abandoned a process for providing oxide materials having a composition described by the formula $SrBi_{2.00}Ta_{2.00-x}$, $Nb_xO_9$ (SBTNO) where x ranges from 0.00 to 2.00 and is controlled to within about 1%, having improved high temperature performance. A batch of the desired composition is initially prepared by conventional processes to provide a nominal composition that may be close to the desired composition, but not the exact desired composition. A portion of the batch is processed to form a thin film, the stoichiometry of which is then analyzed. The batch composition is then modified by adding thereto a quantity of one or more of the constituents to bring the batch composition to the desired stoichiometry. Further improved high temperature performance is achieved with values of x within the range of about 0.10 to 1.9, and more preferably, about 0.4 to 0.7, and most preferably about 0.56. The thus-modified metal organic acid salt solutions provide ceramic thin films having improved electrical properties (particularly consistent properties from batch to-batch, improved ferroelectric remnant polarization, and much improved high temperature performance) as compared to the thin films prepared from unmodified solutions.

Although the process provides improved electrical properties, it has been subsequently discovered that ferroelectric thin film capacitors made by the process evidence leakage currents that are capable of being improved by the process of the present invention.

SUMMARY OF THE INVENTION

In accordance with the present invention, a process is provided for preparing mixed oxide materials having improved leakage characteristics when formed into a capacitor. The process comprises:

(a) preparing a solution of a liquid precursor of the mixed metal oxide materials having a given composition in a water-immiscible solvent;

(b) adding a small amount of water to the solution to form a two-phase mixture;

(c) refluxing the two-phase mixture for a period of time; and (d) removing the water.

Optionally, an amount of the water-immiscible solvent may be added prior to removing the water. In this case, both the added amount of the water-immiscible solvent and the water are removed simultaneously.

The treated metal organic acid salt solutions provide ceramic thin films having improved leakage current characteristics as compared to the prior art thin films prepared from untreated prior art solutions.

BRIEF DESCRIPTION OF THE DRAWINGS

FIG. 3, on coordinates of current density (in amp/cm$^2$) and voltage (in volts), is a plot of the current-voltage (I-V) characteristics of a number of ferroelectric capacitor dielectric films formed from an untreated mixed metal alkoxide organic acid material of the prior art, from such materials following equilibration hydrolysis, and at stages in between.

DESCRIPTION OF THE PREFERRED EMBODIMENTS

The present invention discloses a technique to improve the leakage characteristics of thin film metal oxide dielectrics and, more specifically, ferroelectric thin films. Solution deposition of mixed metal organometallic solution remains a standard technique used to produce thin films of a variety materials. The present invention involves a modification to the solutions which gives, after standard processing, surprisingly improved leakage performance capacitors made from the materials.

Figure 1:
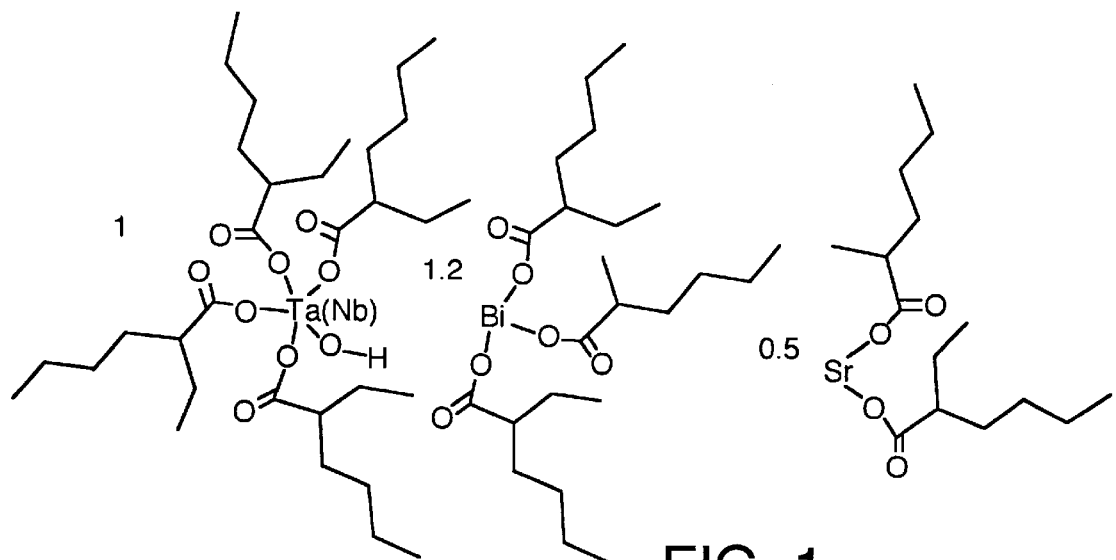
FIG. 1 is a schematic representation of mixed metal alkoxide organic acid materials formed in accordance with a prior art process.
Figure 2:
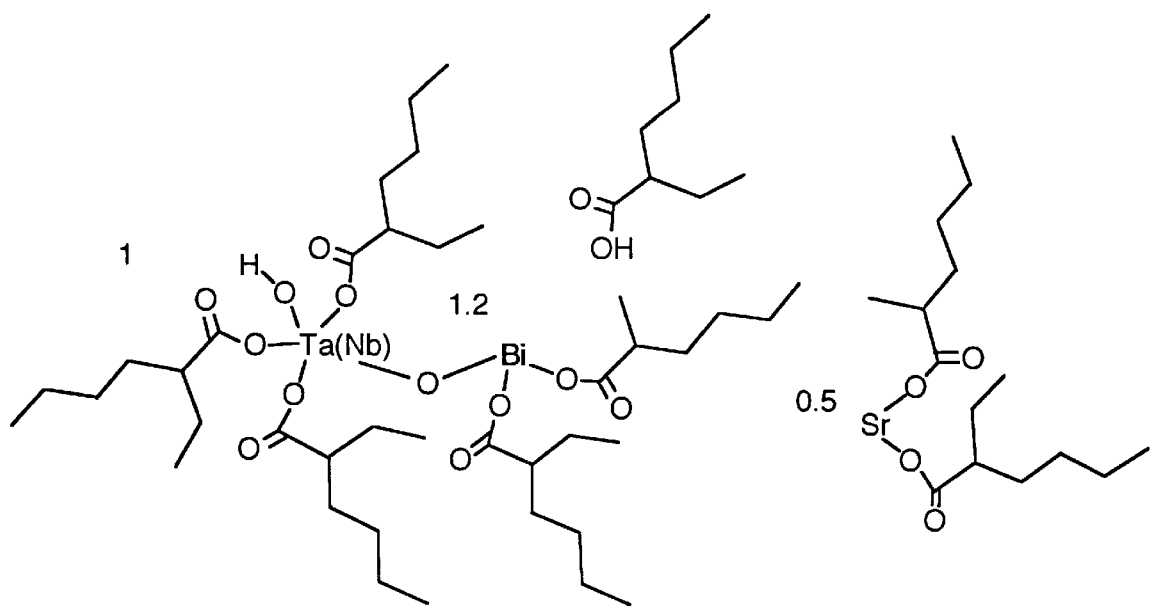
FIG. 2 is a theorized schematic representation of the mixed metal alkoxide organic acid materials following equilibration hydrolysis in accordance with the present invention.

Solution deposition of metallic oxide thin films is generally based on one of two methods: (1) sol-gel, which employs soluble metal alkoxides of the metals; and (2) MOD (metallo-organic decomposition), which employs soluble metal organic acid (salts) materials. During the course of investigations directed to the MOD approach, which resulted in the development of a number of inventions, which are disclosed and claimed in applications Ser. No. 08/635,313, filed Apr. 19, 1996, and Ser. No. 08/669,122, filed Jun. 24, 1996, the present inventors surmised that thermal equilibration and controlled hydrolysis of the mixed metal species in solution might lead to chemically modified solutions (more homogenous, less organic acid constituents), which could have different electrical properties than the as-synthesized materials. The MOD solution chemical composition (after conventional Symetrix synthesis) is shown in FIG. 1, comprising 1 Ta(Nb) (2-ethyl hexanoate)$_4$—OH, 1.2 Bi (2-ethyl hexanoate)$_3$, and 0.5 Sr (2-ethyl hexanoate)$_2$. The likely chemical events occurring during the controlled hydrolysis equilibration condensation of the different metal organic salt constituents result in the mixture depicted in FIG. 2, which shows displacement of the hydrogen on the —OH group, resulting in bonding of the Ta(Nb) to Bi through the oxygen atom. The displaced hydrogen combines with one of the ether groups on the Bi atom to form 2-ethyl hexanoic acid. In the solutions depicted in FIGS. 1 and 2, the solvent is a mixture of xylenes (ortho-, meta-, and para-xylene), as is well-known in this art.

Figure 3:
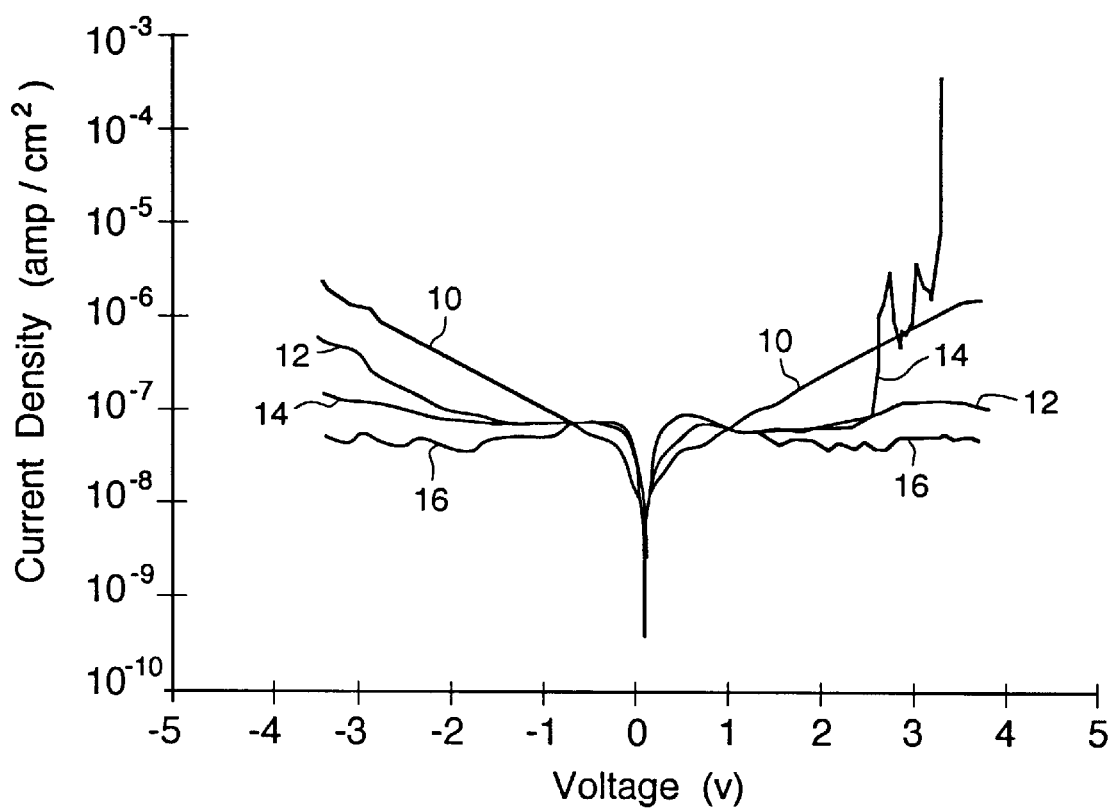

The present inventors first equilibrated a standard Y1 (SBTO) solution (made by the method of Symetrix) ("non-equilibrated") by refluxing the solution over a period of 24 hours to form an equilibrated solution. The electrical data for the non-equilibrated solution and equilibrated solution are shown in FIG. 3 as Curves 10 and 12, respectively. As can be clearly seen, the leakage current is improved for the capacitor made from the equilibrated solution. The remaining solution was then re-acted with a small amount of water by addition of water and refluxed. A portion of this solution was processed to form the capacitor structure and this data is shown as Curve 14 in FIG. 3. Finally, the water in the solution was removed by azeotropic distillation. The data from a capacitor made from this solution is shown in FIG. 3 as Curve 16. The leakage data for this solution is improved yet again.

Improved films, specifically, improved in leakage current, are unchanged from solution to solution and may be made by controlled equilibration and hydrolysis of the standard synthesized solution precursors.

As an example, during the production of the YZ (SBTNO) materials, capacitors from one of the many precursor solutions made during this time were found to have significantly higher leakage current as compared to the others. This solution was equilibrated/hydrolyzed as described above. The leakage current of capacitors fabricated from the solutions (5 volts) improved from $1.0 \times 10^{-4}$ amps/cm$^3$–cm to $70 \times 10^{-8}$ amps/cm$^3$–cm.

In the preferred practice of the present invention, about 1 to 10 vol % water, preferably about 2 to 4 vol %, is added to the xylenes-based solution and refluxed for a sufficient period of time to equilibrate the solution. A period of time of 8 to 36 hours is usually sufficient, with a period of time of about 24 hours preferred. A predetermined amount of solvent is then added to the mixture, such as about 20 to 40 vol % of the xylenes mixture, and the excess solvent and the water are azeotropically distilled off, resulting in the original composition of the solution prior to equilibration and distillation. The amount of precursor solution remaining is the same as the amount at the beginning of the process of the present invention.

As an example, in a 50 ml batch of mixed metal oxide precursor solution, 2 ml water was added, and the resulting two-phase mixture was refluxed in a closed system for 24 hours. Solvent in the amount of 10 to 20 ml was then added to the refluxed mixture and this amount of solvent was then removed, such as by azeotropic distillation, leaving 50 ml of mixed metal oxide precursor solution. As indicated above, the leakage current of capacitors prepared from precursor solutions subjected to the process of the present invention was reduced by a factor of about 142x.

In another example, to 41.7 grams of a xylene-based YZ MOD precursor made by the method disclosed in previously-referenced application Ser. No. 08/669,122 was added 1.0 gram of distilled water and 10.1 grams of toluene. The two-phase mixture was heated to gentle reflux for 16 hours. The reaction was cooled, and the reflux condenser was replaced by a short path distillation unit. The water and toluene were removed by azeotropic distillation to give 40.5 grams of material. This was diluted to 41.7 grams with xylenes and processed to give ferroelectric capacitors in the usual manner. Capacitors made from the material processed in accordance with the teachings of the present invention had improved leakage current performance as compared to the starting MOD precursor.

Thus, there has been disclosed a method for modifying the starting MOD precursor solution of metal oxide films which significantly improves the leakage current of the capacitors made from the solutions. It will be appreciated by those skilled in this art that various changes and modifications of an obvious nature may be made, and all such changes and modifications are considered to fall within the scope of the present invention, as defined by the appended claims.

What is claimed is:

1. A process for preparing thin film mixed metal oxide materials having improved leakage characteristics when formed into a capacitor, said process comprising:
   (a) preparing a solution of a liquid precursor of said mixed metal oxide materials having a given composition in a water-immiscible solvent;
   (b) adding about 1 to 10 vol % of water to said solution to form a two-phase mixture;
   (c) refluxing said two-phase mixture for a period of time; and
   (d) removing said water.

2. The process of claim 1 wherein said amount of water is within a range of about 2 to 4 vol % of said solution.

3. The process of claim 1 wherein said period of time of said refluxing is within the range of about 8 to 36 hours.

4. The process of claim 3 wherein said period of time is about 24 hours.

5. The process of claim 1 wherein an additional amount of said water-immiscible solvent is added prior to removing said water and is subsequently removed with said water.

6. The process of claim 5 wherein said additional amount of said water-immiscible solvent is within a range of about 20 to 40 vol % of said solution.

7. The process of claim 1 wherein said water-immiscible solvent comprises a mixture of xylenes.

8. The process of claim 1 wherein said water is removed by azeotropic distillation.

* * * * *